US006990651B2

(12) United States Patent
Balasubramanian et al.

(10) Patent No.: US 6,990,651 B2
(45) Date of Patent: Jan. 24, 2006

(54) ADVANCED DESIGN FORMAT LIBRARY FOR INTEGRATED CIRCUIT DESIGN SYNTHESIS AND FLOORPLANNING TOOLS

(75) Inventors: Balamurugan Balasubramanian, Mountain View, CA (US); Juergen Lahner, Sunnyvale, CA (US); Srinivas Adusumalli, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 296 days.

(21) Appl. No.: 10/438,530

(22) Filed: May 14, 2003

(65) Prior Publication Data

US 2004/0230919 A1 Nov. 18, 2004

(51) Int. Cl.
*G06F 17/50* (2006.01)
(52) U.S. Cl. ............................... 716/18; 716/1; 716/12
(58) Field of Classification Search ................ 716/3–6, 716/10–12, 18, 1
See application file for complete search history.

(56) References Cited

U.S. PATENT DOCUMENTS

| | | | |
|---|---|---|---|
| 5,537,330 A | 7/1996 | Damiano et al. | |
| 5,555,201 A | 9/1996 | Dangelo et al. | |
| 5,870,308 A * | 2/1999 | Dangelo et al. | ............... 716/18 |
| 6,145,117 A | 11/2000 | Eng | |
| 6,289,498 B1 | 9/2001 | Dupenloup | |
| 6,292,931 B1 | 9/2001 | Dupenloup | |
| 6,360,356 B1 | 3/2002 | Eng | |
| 6,378,123 B1 | 4/2002 | Dupenloup | |
| 6,421,818 B1 | 7/2002 | Dupenloup et al. | |
| 6,438,730 B1 | 8/2002 | Atmakuri et al. | |
| 6,449,761 B1 * | 9/2002 | Greidinger et al. | ............ 716/11 |
| 6,807,660 B1 * | 10/2004 | Frenkil | .......................... 716/6 |

OTHER PUBLICATIONS

Advanced Library Format (ALF) Home page (from website www.eda.org/alf).*
Focus Report: Logic Synthesis and Silicon Compilation Tools by Steven E. Schulz, Eedesign; http://www.eedesign.com/eedesign/focusreport9605.html.

* cited by examiner

*Primary Examiner*—Paul Dinh
(74) *Attorney, Agent, or Firm*—Fitch, Even, Tabin & Flannery

(57) ABSTRACT

An integrated circuit design library includes a timing parameter representative of a design element in an integrated circuit; an area size parameter representative of the design element in an integrated circuit; and a routing demand parameter representative of a number of connections required for the design element for each value of the timing parameter and the area size parameter.

15 Claims, 4 Drawing Sheets

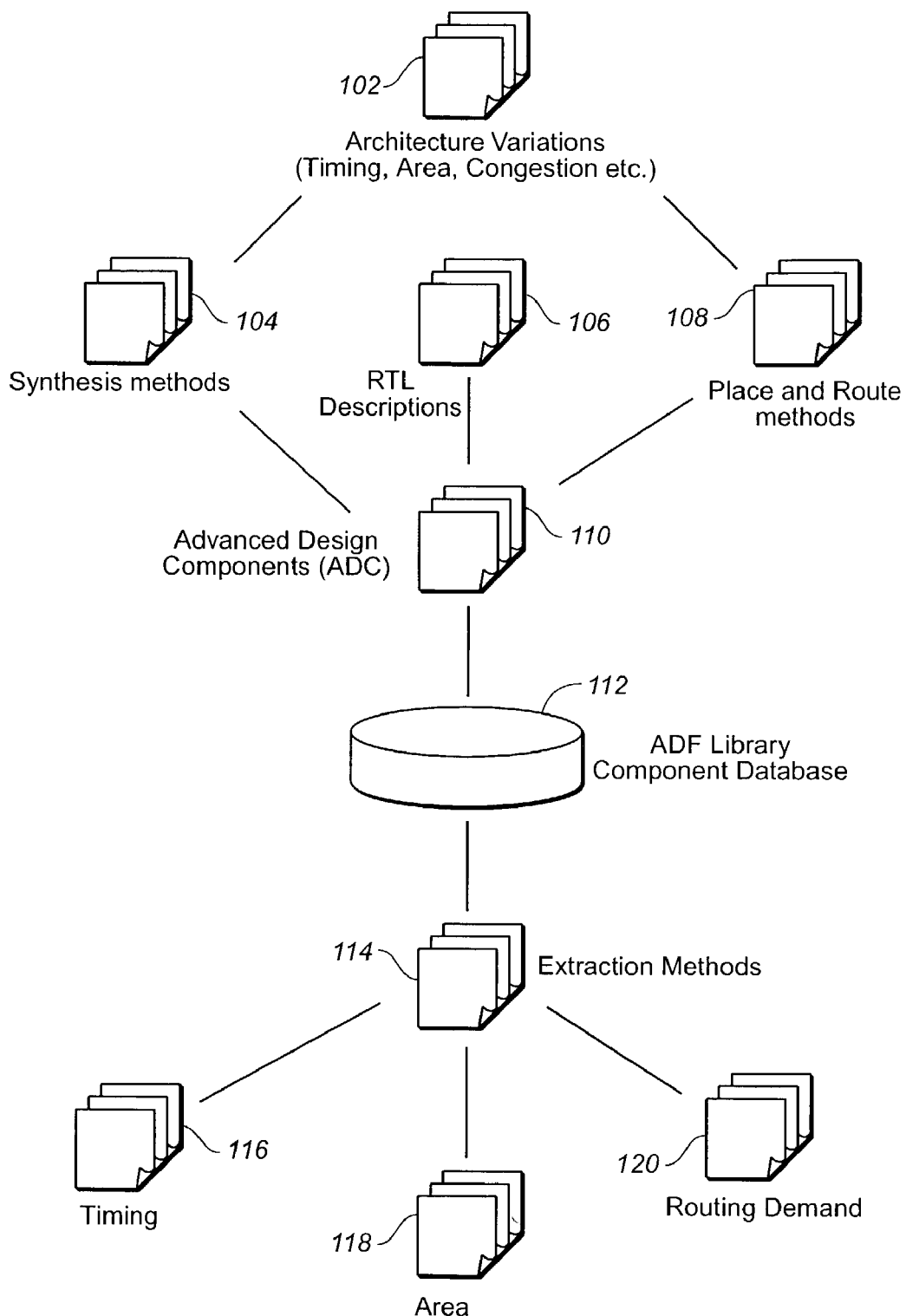
FIG._1

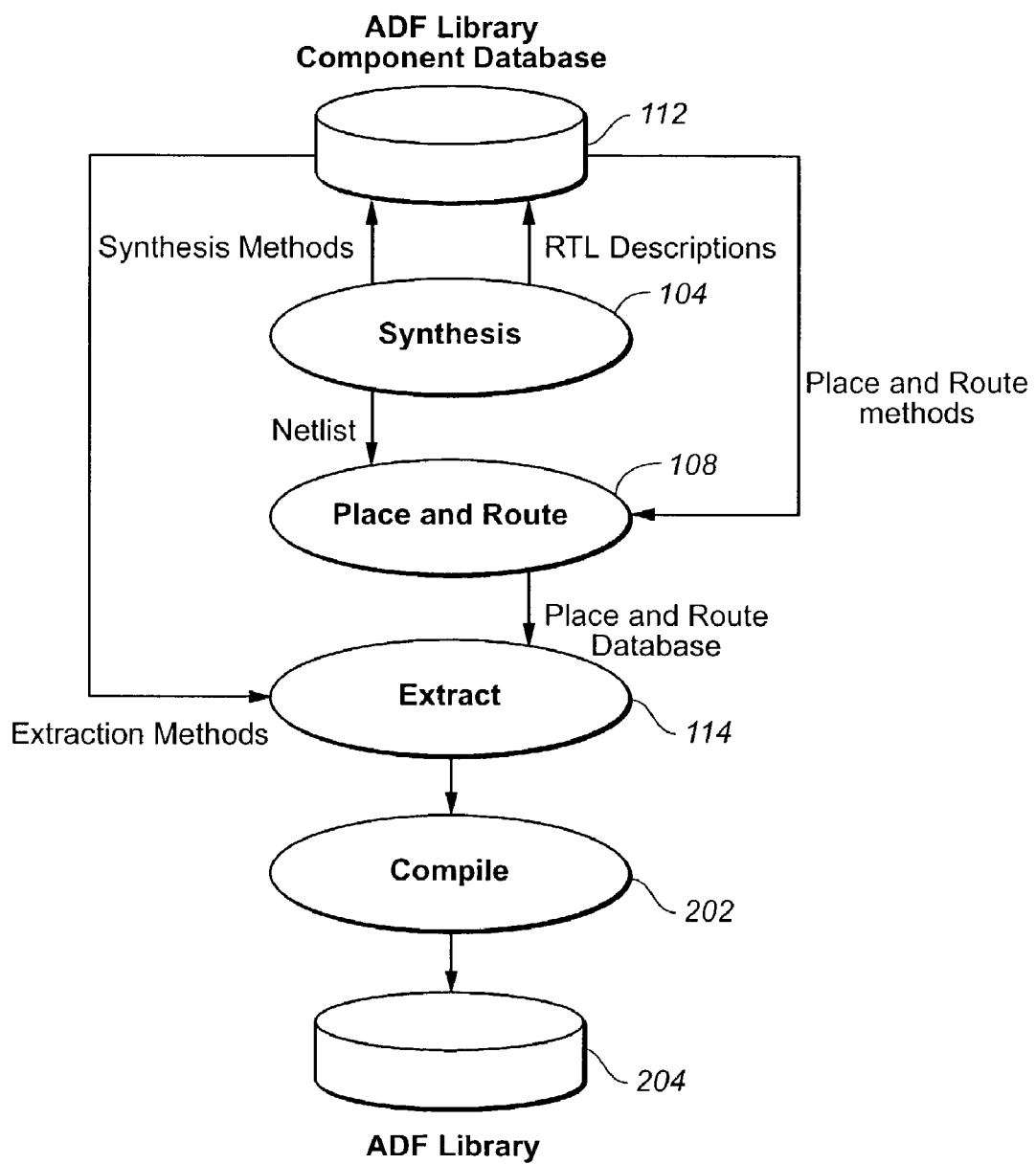
FIG._2

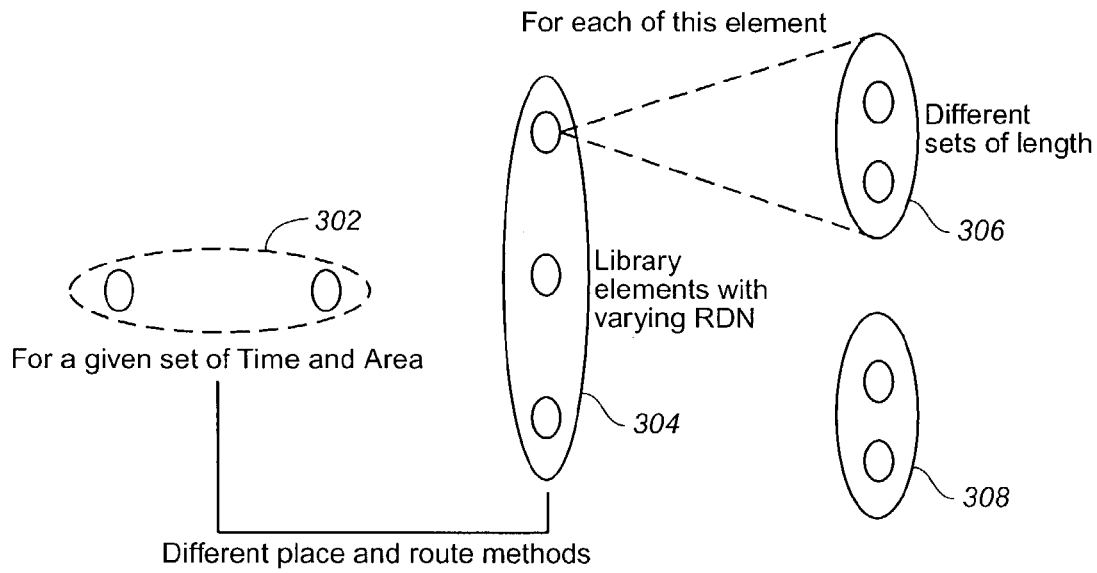
FIG._3
```
Cell (CSA12DT9A9RD4DF99) {                    ← 400
    ;Timing block
    Timing {
        ; pinwise timing arc and functional description
        ; related pins and clock descriptions
    }
    ; Area Block
    Area {
        ; area information in predefined units (say um)
        ; shape information and coordinates
    }
    ;Congestion block
    Routing_Demand {
        ; routing demand number
        ; number of internal nets
        ; number of external nets
        ; total internal pins
    }
    ...
}
```
FIG._4

ADVANCED DESIGN FORMAT LIBRARY FOR INTEGRATED CIRCUIT DESIGN SYNTHESIS AND FLOORPLANNING TOOLS

BACKGROUND OF THE INVENTION

1. Field of the Invention

The present invention is directed to integrated circuit design software used in the manufacture of integrated circuits. More specifically, but without limitation thereto, the present invention is directed to a library of elements for synthesizing hardware description language (HDL) from register transfer level (RTL) code.

2. Description of the Prior Art

Identifying and estimating routing congestion in an integrated circuit design is one of the fundamental issues in very large scale integrated circuit (VLSI) design. In conventional software tools for synthesizing hardware description language (HDL) from register transfer level (RTL) code, components are selected from a library and mapped to a hardware description language. The routing congestion is then estimated using probabilistic models during trial circuit layout and floorplanning.

SUMMARY OF THE INVENTION

In one aspect of the present invention, an integrated circuit design library includes a timing parameter representative of a design element in an integrated circuit; an area size parameter representative of the design element in an integrated circuit; and a routing demand parameter representative of a number of connections required for the design element for each value of the timing parameter and the area size parameter.

In another aspect of the present invention, a computer program product for an integrated circuit design library includes a medium for embodying a computer program for input to a computer and a computer program embodied in the medium for causing the computer to perform the following functions: extracting a value for a timing parameter from a netlist; extracting a value for an area size parameter from the netlist; and calculating a value for a routing demand parameter from the netlist.

DESCRIPTION OF THE DRAWINGS

The present invention is illustrated by way of example and not limitation in the accompanying figures, in which like references indicate similar elements throughout the several views of the drawings, and in which:

FIG. 1 illustrates a flow diagram of an advanced design format (ADF) database used to generate an advanced design format library according to an embodiment of the present invention;

FIG. 2 illustrates a flow diagram of an advanced design format library generated from the advanced design format database of FIG. 1;

FIG. 3 illustrates some possible combinations of selected parameters for a library element of an advanced format design library according to an embodiment of the present invention;

FIG. 4 illustrates an example of computer code for a library element according to an embodiment of the present invention.

Figure 5:
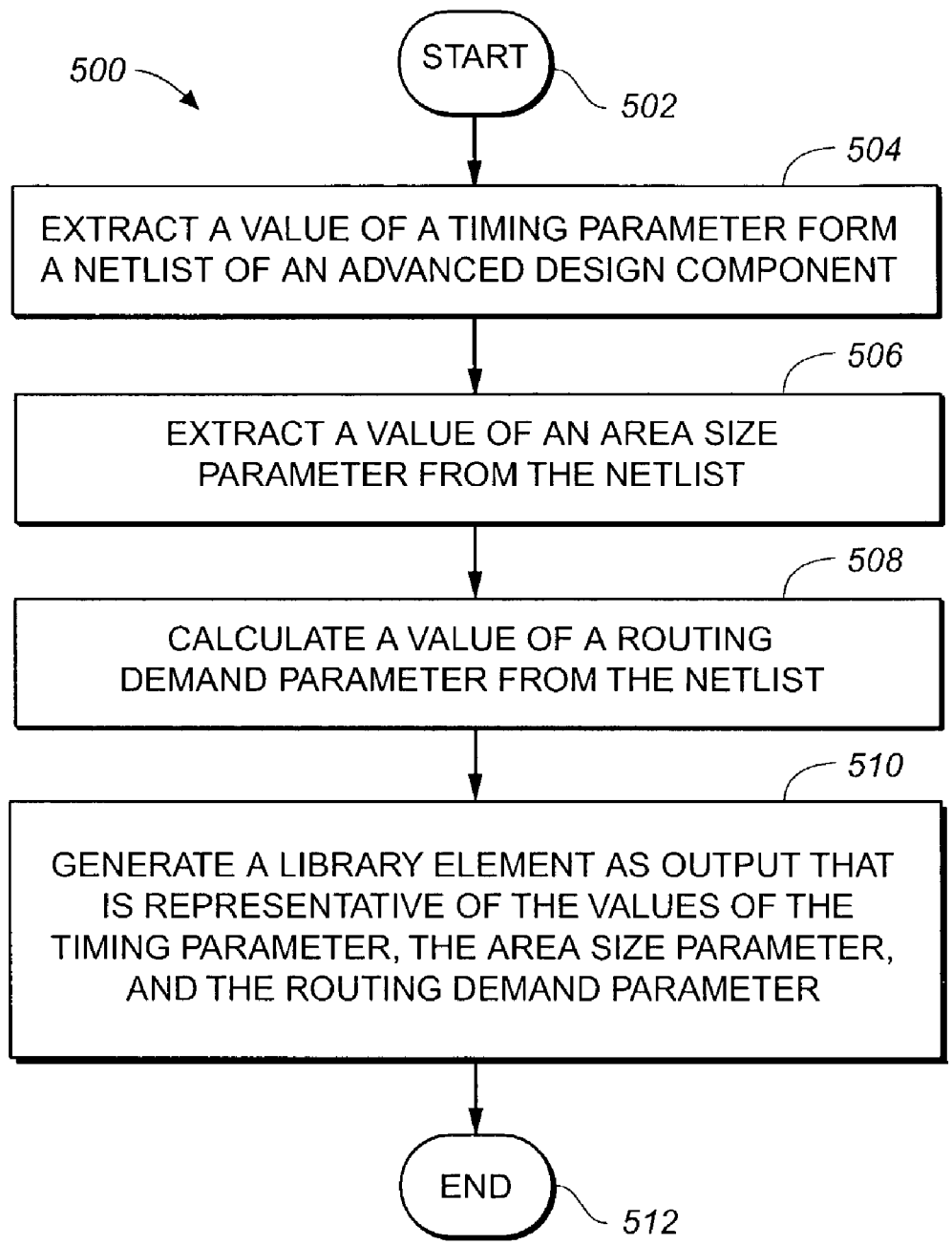
FIG. 5 illustrates a flow chart for an integrated circuit library according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Congestion is a fundamental issue in very large scale integrated circuit (VLSI) design. Congestion estimation and analysis have gained increasing importance as the size and complexity of designs grow. It is therefore desirable to identify potential congestion problems early in the design cycle. Previous methods of estimating congestion are typically employed in the netlist placement phase, when the design information is lost in a multitude of gates and the placement of cells is nearly fixed. Even though congestion avoidance is the main objective of currently used global routing tools, optimization performance of these tools is minimal, because congestion is primarily due to the manner in which the RTL code was designed than to cell placement and/or netlist synthesis. Reducing utilization and increasing cell padding size may assist in reducing congestion, but not enough to avoid significant design delays. There is insufficient insight at the netlist placement phase to enable redesigning or repartitioning the design at the RTL code level. The global routing tools simply pass on the congestion problems to the next phase of the design, for example, detailed routing, or else generate timing tradeoffs.

In previous technology libraries used to map register transfer level (RTL) code to a hardware description language (HDL), there is no routing demand or congestion information contained in the library elements that may be used to avoid routing conflicts in the synthesis and floorplanning of the integrated circuit design due to routing congestion. As a result, a substantial amount of time may be required in trial and error layouts to resolve the routing congestion conflicts.

In the present invention, an advanced design format (ADF) library is provided in which the library elements include routing demand information in addition to the conventional timing information, area information, and technology specific information, for example, the number of metal layers, the number of tracks per grid, and so on.

In one aspect of the present invention, a library of elements representative of components for an integrated circuit design includes a time parameter, an area size parameter, a routing demand parameter, and a drive length parameter for each of the components. The time parameter includes a timing table of propagation, rise and fall times for best case, typical case and worst case operating conditions between the input pins and the output pins of the library element. The area size parameter includes the number and units of area required for placing the library element in a floorplan. The routing demand parameter is representative of a number of connections required for routing the library element.

FIG. 1 illustrates a flow diagram of an advanced design format (ADF) database used to generate an advanced design format library according to an embodiment of the present invention. Shown in FIG. 1 are architectural variations 102, synthesis methods 104, register transfer level (RTL) code descriptions 106, place and route methods 108, advanced design components (ADC) 110, an advanced design format (ADF) database 112, extraction methods 114, timing parameters 116, area size parameters 118, and routing demand parameters 120.

The advanced design components (ADC) 110 are the common, basic design elements representative of structures that may be mapped into a hardware description language (HDL). Examples of these basic design elements include adders, multipliers, multiplexers, bitwise logical operators, and dividers. Each of these basic design elements is described for various area size parameters 118 and architectural variations 102. For example, a multiplexer may be implemented as a 2:1 multiplexer, a 4:1 multiplexer, and so on, and may have a single bitwidth or a multiple bitwidth. The architectural variations 102 may be based on the register transfer level (RTL) code descriptions 106, for example, using case statements, assign statements, and so on.

For each advanced design component 110 having a specific architectural variation 102, there are generally several synthesis methods 104 to achieve variations in the timing parameters 116 and the area size parameters 118. Some synthesis methods 104 may be used to constrain a synthesis tool to yield an implementation having a low routing demand or a high routing demand. For example, a 32:1 multiplexer may be implemented by a plurality of and-or gates, or by a tree of 2:1 multiplexers, or by a tree of 4:1 multiplexers, and so on. Each of these implementations may be further constrained by the timing parameters 116 and the area size parameters 118 to result in a single register transfer level code description 106 of an advanced design component 110 that may be associated with more than one synthesis method. Likewise, a single advanced design component 110 may be associated with several place and route methods, each yielding a different routing demand parameter 120. For example, using different routing utilization or placement constraints will result in the same synthesized netlist with different routing demand parameters 120. The advanced format design library 112 includes the various synthesis/place and route methods 108 that may be generic to several advanced design components 110 and may also include special place and route methods 108 applicable to specific advanced design components 110, for example, multiplexers and multipliers. The routing demand parameter 120 is representative of a number of connections required for an element in the advanced design format database 112 for specific values of the timing parameter 116 and the area size parameter 118.

The extraction methods 114 are algorithms that are used to extract information from the netlist and/or the place and route database about the timing parameters 116, the area size parameters 118, and the routing demand parameters 120 for each advanced design component 110 in a format that may be used to compile the advanced design format database 112. The routing demand parameters 120 include routing congestion and an associated length unit that may be driven by the corresponding advanced design component 110. The extraction methods 114 are also included in the advanced design format library 112 and are common to all of the advanced design components 110. The timing parameters 116 and the area size parameters 118 are extracted according to well-known techniques and formats.

An important feature of the present invention is the inclusion of the routing demand parameters 120. A routing demand parameter 120 may be, for example, an internal routing demand number that may be calculated according to well-known techniques as a function of the total wire length in the netlist for each advanced design component in the advanced design component database 110. The number of length units that an advanced design component can drive may also be derived according to well-known techniques from the drive cells in the netlist for each advanced design component 110. Alternatively, the drive cells in the netlist may be replaced with high drive strength cells to generate advanced design components 110 having higher length unit values and the same functionality.

FIG. 2 illustrates a flow diagram of an advanced design format library generated from the advanced design format database of FIG. 1. Shown in FIG. 2 are an advanced design format component database 112, synthesis methods 104, place and route methods 108, extraction methods 114, a compiling step 202, and an advanced design format library 204. The following steps describe how an advanced design format library according to an embodiment of the present invention may be generated for use with integrated circuit design software tools. Although the example described herein is directed to the widely accepted industry standard of advanced design format (ADF) for compatibility with industry standard synthesis and placement tools, other integrated circuit design library formats may also be used to practice various embodiments of the present invention within the scope of the appended claims.

(1) A set of advanced design components is defined as described above in the advanced design components database 110.

(2) For each advanced design component in the advanced design components database 110, the associated synthesis methods 104 and place and route methods 108 are identified.

(3) Using the register transfer level code for the advanced design component and one of the associated synthesis methods 104, a netlist for the advanced design component is generated according to well-known techniques.

(4) The netlist is placed and routed according to one of the place and route methods 108.

(5) The extraction methods 114 are used to extract information about timing, area size, and routing demand. The extracted information may be stored in an intermediate database 112 according to well-known techniques.

(6) Steps (4) and (5) are repeated for each place and route method associated with the advanced design component.

(7) Steps (3–6) are repeated for each of the synthesis methods 104 associated with the advanced design component.

(8) Steps (2–7) are repeated for each advanced design component in the advanced design components database 110, for each combination of timing, area size, and routing demand. The following example illustrates four variations each of timing, area size, and routing demand, however, fewer or more than four of each of these parameters may be used to suit specific applications within the scope of the appended claims:

Timing: T1, T2, T3, T4 where T1<T2<T3<T4

Area: A1, A2, A3, A4 where A1<A2<A3<A4

Routing demand number (RDN): RD1, RD2, RD3, RD4 where RD1<RD2<RD3<RD4

Given the above variations for each parameter, each of the advanced design components in the library will have several combinations for the same function. Table 1 below illustrates an example of four possible combinations of timing, area size, routing demand number RDN, and drive length NL for an adder library element having a specific architecture of, for example, a carry save adder, 32 bits wide.

TABLE 1

| NO. | TIMING | AREA SIZE | RDN | NL |
|---|---|---|---|---|
| 1 | T1 | A4 | RD4 | L |
| 2 | T2 | A3 | RD3 | 2L |
| 3 | T3 | A2 | RD1 | L |
| 4 | T4 | A1 | RD2 | 3L |

FIG. 3 illustrates some possible combinations of selected parameters for a library element of an advanced format design library according to an embodiment of the present invention. Shown in FIG. 3 are a set 302 of two variations of a given timing and area size for an advanced design component, a set 304 of three variations for different place and route methods, and two sets 306 and 308 of two variations each for different drive lengths.

As may be appreciated from Table 1 and FIG. 3, many combinations may be generated in the advanced design format library for each of the advanced design components in the advanced design components database having the same functionality and different combinations of specific values of the timing parameter, the area size parameter, and the routing demand parameter.

(9) The technology type information and other standard library attributes, for example, the vendor name and the routing resource number, are extracted during the characterization process of each of the advanced design components and included in the intermediate database.

FIG. 4 illustrates an example of computer code for a library element 400 included in the intermediate database according to an embodiment of the present invention. In the example of FIG. 4, the library element 400 includes three blocks for timing, area size, and congestion.

The timing block includes timing parameters such as setup and hold time for each pin of the block. The timing block may also include related pin descriptions and clock signal requirements.

The area block includes the block area size in predefined units, for example, square microns.

The routing congestion block includes a routing demand number representative of the number of connections required for the block, the number of internal nets, that is, the number of nets that begin and end inside the block, and the number of external nets, that is, the number of nets that begin or end outside the block.

(10) The intermediate database is compiled according to well-known techniques to generate the advanced design format library.

Some important features of the new advanced design format library of the present invention are that routing demand information is included in the library element descriptions, library elements having the same functionality may be defined for different routing demand values, a method for extracting the routing demand for each library element, and a method for utilizing the routing demand during place and route.

The availability of the routing demand value in the advanced design format library enables synthesis and placement tools to allow sufficient chip area for routing without unnecessarily increasing chip area, thereby optimizing an integrated circuit design without the costly iterations and even manual re-design steps typically required to resolve routing congestion problems.

By including several variations having different routing demand values for the same advanced design component in the advanced design format library, the desired functionality may advantageously be selected by synthesis tools according to the general design constraints. The synthesis tools may also use the routing demand parameter in the advanced design format library to converge on a lower overall routing demand parameter value or number for the integrated circuit design in the same manner used by synthesis tools for timing and area size. An example of how a routing demand parameter in the advanced design format library may be used by a synthesis tool is described as follows.

Two parameters are associated with the routing demand number, a routing resource number (RRN) and a congestion estimate value (CEV). The routing resource number (RRN) is defined as a function of routing resources available for a given technology, for example, the number of metal layers and the number of routing tracks per grid. The routing resource number applies to a region, a logical partition, and to a physical partition or physical design.

The routing demand number (RDN) is defined as a function of routing demand, for example, the number of interconnects, the length of the interconnects, and the number of library elements included.

The congestion estimate value (CEV) is defined as the difference between the routing demand number and the routing resource number and may be expressed by the following formula:

$$CEV(\text{region}) = RDN(\text{region}) - RRN(\text{region}) \tag{1}$$

where region is used herein to indicate a region, a logical partition, or a physical partition or design. If the CEV is positive, that is, if the routing demand exceeds the routing resources, then congestion is indicated.

The routing demand parameter is a function of the number and type of library elements in the region, the length of the internal interconnects and the partial length of external interconnects that originate or terminate within the region. Each library element included within the region has an associated routing demand number stored, for example, in the cell library, that contributes to the internal routing demand of the region. The internal routing demand number for the region may be expressed by the following formula:

$$RDN_{internal} = f(RDN_{element}, WL_{I-net}, \partial(WL_{E-net})) \tag{2}$$

where $RDN_{element}$ is the sum of the routing demand numbers for every library element in the region, $WL_{I-net}$ is the wire length of the internal interconnects, and $\partial(WL_{E-net})$ is the partial wire length of an external net based on the distance between a library element pin and an input or output of the region or partition.

The library elements within a region having a high routing demand number may be replaced with other library elements having the same functionality but a smaller routing demand number according to the advanced design format library. By reducing the individual routing demand numbers of the library elements, the total routing demand number of the region may be reduced, thereby reducing congestion. Additionally, external nets that have a high probability of extending across the region may be routed through regions having a smaller routing demand number, thereby redistributing the routing demand for a given technology having a constant routing resource number.

In another aspect of the present invention, a computer program product for an integrated circuit design library includes a medium for embodying a computer program for input to a computer and a computer program embodied in the medium for causing the computer to perform the following functions: extracting a value for a timing parameter from a netlist; extracting a value for an area size parameter from the netlist; and calculating a value for a routing demand parameter from the netlist.

FIG. 5 illustrates a flow chart for a computer program product for an integrated circuit design library according to an embodiment of the present invention.

Step 502 is the entry point of the flow chart 500.

In step 504, a value of a timing parameter is extracted from a netlist of, for example, an advanced design component according to well-known techniques.

In step 506, a value of an area size parameter is extracted from the netlist according to well-known techniques.

In step 508, a value of a routing demand parameter is calculated from the netlist as described above.

The values of other parameters used to define library elements may be extracted from the netlist and other data sources according to well-known techniques to suit specific applications, such as compatibility with industry standard synthesis and placement tools.

In step 510, a library element is generated as output that is representative of the values of the timing parameter, the area size parameter, and the routing demand parameter determined in steps 504, 506 and 508.

Step 512 is the exit point of the flow chart 500.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. An integrated circuit design library for synthesizing hardware description language from register transfer level code comprising:
    a timing parameter representative of a design element in an integrated circuit;
    an area size parameter representative of the design element in an integrated circuit; and
    a routing demand parameter representative of a number of connections required for the design element for a value of the timing parameter and of the area size parameter wherein selected parameters of a library element in the integrated circuit design library comprise different combinations of values of the timing parameter, the area size parameter, and the routing demand parameter.

2. The integrated circuit design library of claim 1 wherein the routing demand parameter is representative of a number of connections required for the library element of the integrated circuit design library for specific values of the timing parameter and the area size parameter.

3. The integrated circuit design library of claim 1 wherein the routing demand parameter is representative of a wire length of internal interconnects required for the library element of the integrated circuit design library.

4. The integrated circuit design library of claim 1 wherein the timing parameter, the area size parameter, and the routing demand parameter have an advanced design format for compatibility with industry standard synthesis and placement tools.

5. The integrated circuit design library of claim 1 further including a plurality of library elements each having the same functionality and different combinations of specific values of the timing parameter, the area size parameter, and the routing demand parameter.

6. A computer program product for an integrated circuit design library comprising:
    a medium for embodying a computer program for input to a computer; and
    a computer program embodied in the medium for causing the computer to perform steps of:
    extracting a value for a timing parameter from a netlist;
    extracting a value for an area size parameter from the netlist; and
    calculating a value for a routing demand parameter from the netlist wherein selected parameters of a library element in the integrated circuit design library comprise different combinations of values of the timing parameter, the area size parameter, and the routing demand parameter.

7. The computer program product of claim 6 wherein the routing demand parameter is representative of a number of connections required for the library element of the integrated circuit design library for specific values of the timing parameter and the area size parameter.

8. The computer program product of claim 6 wherein the routing demand parameter is representative of a wire length of internal interconnects required for the library element of the integrated circuit design library.

9. The computer program product of claim 6 wherein the timing parameter, the area size parameter, and the routing demand parameter have an advanced design format for compatibility with industry standard synthesis and placement tools.

10. The computer program product of claim 6 further comprising a step of generating as output the library element representative of the values of the timing parameter, the area size parameter, and the routing demand parameter.

11. A method of generating an integrated circuit design library comprising steps of:
    extracting a value for a timing parameter from a netlist;
    extracting a value for an area size parameter from the netlist; and
    calculating a value for a routing demand parameter from the netlist wherein selected parameters of a library element in the integrated circuit design library comprise different combinations of values of the timing parameter, the area size parameter, and the routing demand parameter.

12. The method of claim 11 wherein the routing demand parameter is representative of a number of connections required for the library element of the integrated circuit design library for specific values of the timing parameter and the area size parameter.

13. The method of claim 11 wherein the routing demand parameter is representative of a wire length of internal interconnects required for the library element of the integrated circuit design library.

14. The method of claim 11 wherein the timing parameter, the area size parameter, and the routing demand parameter have an advanced design format for compatibility with industry standard synthesis and placement tools.

15. The method of claim 11 further comprising a step of generating as output the library element representative of the values of the timing parameter, the area size parameter, and the routing demand parameter.

* * * * *